US012618146B2

(12) United States Patent
Li et al.

(10) Patent No.: US 12,618,146 B2
(45) Date of Patent: May 5, 2026

(54) SYSTEM AND METHOD FOR FORMING LARGE-AREA ELECTRONIC-GRADE METAL CHALCOGEN THIN FILMS

(71) Applicant: The University of Hong Kong, Hong Kong (CN)

(72) Inventors: Lain-Jong Li, Hsinchu City (TW); Yi Wan, Hong Kong (CN); Yu-Ming Chang, Hong Kong (CN)

(73) Assignee: The University of Hong Kong (CN)

( * ) Notice: Subject to any disclaimer, the term of this patent is extended or adjusted under 35 U.S.C. 154(b) by 0 days.

(21) Appl. No.: 18/823,533

(22) Filed: Sep. 3, 2024

(65) Prior Publication Data

US 2025/0092511 A1     Mar. 20, 2025

Related U.S. Application Data

(60) Provisional application No. 63/582,708, filed on Sep. 14, 2023.

(51) Int. Cl.
*C23C 16/30*     (2006.01)
*C23C 16/455*     (2006.01)

(52) U.S. Cl.
CPC ...... *C23C 16/305* (2013.01); *C23C 16/45544* (2013.01); *C23C 16/45553* (2013.01)

(58) Field of Classification Search
CPC ............ C23C 16/305; C23C 16/45544; C23C 16/45553
See application file for complete search history.

(56) References Cited

U.S. PATENT DOCUMENTS 6,416,822 B1 * 7/2002 Chiang ................ C23C 16/463
                                                    257/E21.171
6,756,235 B1     6/2004 Liu
(Continued)

FOREIGN PATENT DOCUMENTS

| | | |
|---|---|---|
| CN | 110923663 | 3/2020 |
| CN | 111542641 | 8/2022 |
| TW | 201106513 | 2/2011 |

OTHER PUBLICATIONS

Wu et al., Synthesis of Two-Dimensional Transition Metal Dichalcogenides for Electronics and Optoelectronics, InfoMat, vol. 3, No. 4, Nov. 26, 2020, pp. 362-396.

*Primary Examiner* — Michael G Miller
(74) *Attorney, Agent, or Firm* — Van Pelt, Yi & James LLP

(57)     ABSTRACT

A vapor deposition system is described. The vapor deposition system includes a reaction chamber and a reactant delivery subsystem coupled with the reaction chamber. The reaction chamber is configured to retain a substrate therein. The reactant delivery subsystem includes inlets, a pre-reaction region, and outlets. The inlets receive precursors and chalcogen precursor(s). The pre-reaction region is configured to receive the precursors from a portion of the inlets and to react at least a portion of the precursors to form modified precursor(s). The modified precursor(s) are more thermally stable than metal-containing precursor(s) of the precursors used to form the modified precursor(s). The outlets are coupled with the reaction chamber and the pre-reaction region. The outlets separately provide the modified precursor(s) and the chalcogen precursor(s) to the reaction chamber. The modified precursor(s) and the chalcogen precursor(s) react and form a chalcogen film on the substrate in the reaction chamber.

18 Claims, 10 Drawing Sheets

650

(56)                    References Cited

U.S. PATENT DOCUMENTS

|                |          |             |               |
|----------------|----------|-------------|---------------|
| 8,617,972 B2   | 12/2013  | Zheng       |               |
| 10,062,568 B2  | 8/2018   | Pickett     |               |
| 10,325,987 B2  | 6/2019   | Park        |               |
| 2007/0215036 A1* | 9/2007 | Park ................. | C23C 16/45551 |
|                |          |             | 117/88        |
| 2013/0306927 A1* | 11/2013 | Marsh ............... | H10N 70/8828 |
|                |          |             | 423/276       |
| 2016/0056032 A1* | 2/2016 | Baldasseroni .... | C23C 16/45527 |
|                |          |             | 438/778       |
| 2016/0068961 A1 | 3/2016 | Liu          |               |
| 2022/0262632 A1 | 8/2022 | Yahata       |               |

* cited by examiner

400

Modified
Precursor(s), etc.

Chalcogen-Containing
Precursor(s)

Chalcogen-Containing
Precursor(s)

Modified
Precursor(s), etc.

Modified
Precursor(s), etc.

472        434        472        434        472

451

450        455        456        452

454

450

452

454

434

451

500

510

520

Metal-Containing Precursor

Modifier (Precursor)

Pressure controller

Valve

Mass flow controller

Carrier gas

Mass flow controller

Sulfur source

Material Container
(Metal-containing)

Carrier gas

Material Container
(Modifier)

Valve

Chalcogen-Containing
Precursor

Optional Dopant
Precursor

Valve

Mass flow controller

Precursors

600

650

From Pre-Reaction Region

From Pre-Reaction Region

655

652

654

Chalcogen-Containing Precursor

650

652

654

700

800

900

910

920

SYSTEM AND METHOD FOR FORMING LARGE-AREA ELECTRONIC-GRADE METAL CHALCOGEN THIN FILMS

CROSS REFERENCE TO OTHER APPLICATIONS

This application claims priority to U.S. Provisional Patent Application No. 63/582,708 entitled VAPOR DEPOSITION AND DOPING METHOD TO FORM LARGE-AREA ELECTRONIC-GRADE METAL CHALCOGEN ULTRA-THIN FILMS filed Sep. 14, 2023 which is incorporated herein by reference for all purposes.

BACKGROUND OF THE INVENTION

Two-dimensional (2D) transition metal chalcogenide (TMC) materials may include binary, ternary, quaternary, and multinary oxides, sulfides, selenides, and tellurides. TMCs have applications in a variety of fields. For example, 2D TMCs, such as $MoS_2$, $WSe_2$, $WS_2$, $MoTe_2$, $MoSe_2$, $SnS_2$, and SnS, may be semiconductors. Such films, as well as other TMC materials (e.g. TMCs in the form of metals such as $WTe_2$, $TiSe_2$), may be used in electronic applications.

Although TMCs are of interest, growing TMC films using conventional vapor deposition techniques (e.g. chemical vapor deposition (CVD) and/or atomic layer deposition (ALD)) suffers from a variety of drawbacks. Conventional vapor deposition techniques may require precise temperature control within a narrow range. This makes processing more difficult and costly. Such techniques may also suffer from poor process efficiency because many volatile metal-containing precursors have a low decomposition temperature. These precursors may decompose before reaching the reaction temperature for formation of the TMC. Such metal-containing precursors may also have a small diffusion length, resulting in TMC films that are grown over only a small area of the substrate (e.g. on the order of one or two square centimeters or less). Doping using conventional vapor deposition may also be problematic. Although dopants may be introduced to the reaction chamber in a gaseous phase, the resulting materials may not have the desired uniformity or concentration of dopants. Carbon residue, which originates from organic ligand(s) in the precursors, may present a serious issue in vapor deposition systems. Consequently, techniques for formation of chalcogenides, particularly 2D TMCs, are desired.

BRIEF DESCRIPTION OF THE DRAWINGS

Various embodiments of the invention are disclosed in the following detailed description and the accompanying drawings.

DETAILED DESCRIPTION

Figure 1:
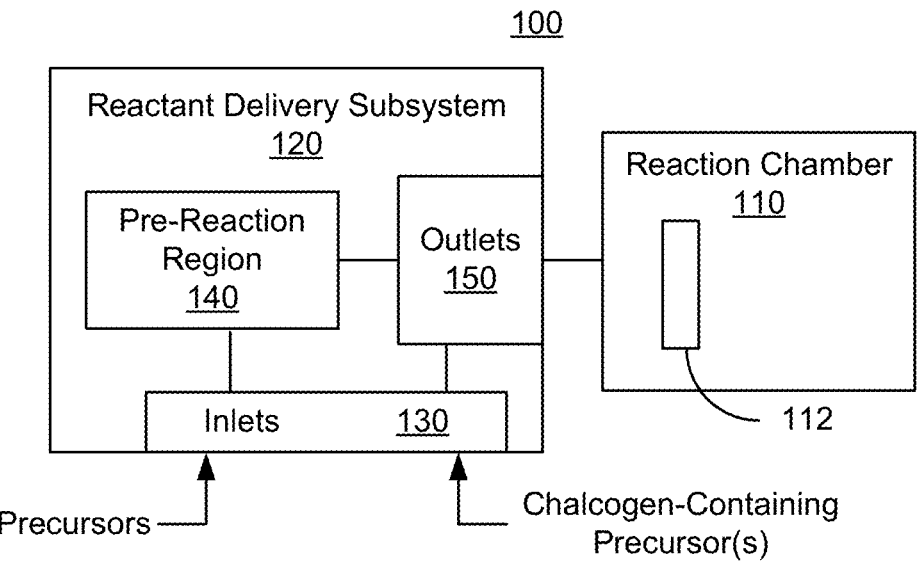
FIG. 1 is a block diagram depicting an embodiment of a vapor deposition system for providing a metal chalcogenide material.

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A vapor deposition system is described. The vapor deposition system includes a reaction chamber and a reactant delivery subsystem coupled with the reaction chamber. The reaction chamber is configured to retain a substrate therein. The reactant delivery subsystem includes inlets, a pre-reaction region, and outlets. The inlets receive precursors and chalcogen precursor(s). The pre-reaction region is configured to receive the precursors from a portion of the inlets and to react at least a portion of the precursors to form a modified precursor. The modified precursor is more thermally stable than a metal-containing precursor that is part of the precursors used to form the modified precursor. The modified precursor may have a higher disassociation temperature and/or a longer diffusion length than the metal-containing precursor. The outlets are coupled with the reaction chamber and the pre-reaction region. The outlets separately provide the modified precursor and the chalcogen precursor(s) to the reaction chamber. In some embodiments, therefore, the modified precursor and chalcogen precursor(s) are separated until flowing out of the outlets and/or mixing in the reaction chamber. The modified precursor and the chalcogen precursor(s) react in the reaction chamber and form a chalcogen film on the substrate.

The precursors may also include a modifier that reacts with the metal-containing precursor to form the modified precursor. In some embodiments, the precursors include a dopant precursor. In such embodiments, the chalcogen film includes a dopant in the dopant precursor. For example, the metal-containing precursor may include W and/or Mo. The precursors may also include water (e.g. as a modifier that reacts with the metal-containing precursor), Fe (e.g. in a dopant precursor) and/or V (e.g. in a dopant precursor). The chalcogen precursor(s) may include S, Se, and/or Te.

In some embodiments, the reactant delivery subsystem includes a heated pre-reaction chamber and a distribution unit. The heated pre-reaction chamber includes the pre-reaction region therein. The precursors react to form the modified precursor in the absence of the chalcogen precursor(s) within the heated pre-reaction chamber. The distribution unit is coupled with the heated pre-reaction chamber by a flow channel. The distribution unit includes the outlets and is coupled with at least one inlet of the plurality of inlets for the chalcogen precursor(s). In some embodiments, the pre-reaction region is adjacent to the outlets. The precursors react to form the modified precursor in the absence of the chalcogen precursor(s) within the pre-reaction region. In some such embodiments, the modified precursor and/or other reactants may be provided directly from the pre-reaction region to the outlets.

In some embodiments, the pre-reaction region includes a heater. The temperature of the pre-reaction region during use may be less than a reaction chamber temperature of the reaction chamber during formation of the chalcogenide. In other embodiments, the pre-reaction region temperature during use may be the same as or greater than the temperature of the reaction chamber during formation of the chalcogenide. The reactant delivery subsystem may further include a cooling region coupled with the portion inlets and the pre-reaction region. The cooling region is configured to maintain a cooling region temperature less than a disassociation temperature of the metal-containing precursor.

A first portion of the outlets is coupled with the pre-reaction region and provides the modified precursor to the reaction chamber. A second portion of the outlets provides the chalcogen precursor(s) to the reaction chamber separately from the modified precursor.

The reactant delivery subsystem may also include a gas distribution system. The gas distribution system is coupled with the outlets such that at least a portion of the outlets have a separately controllable flow rate. In some embodiments, the flow rate of each outlet is separately controllable.

The substrate has a substrate area. The outlets are distributed over an area of the pre-reaction region. The area is at least ½ of the substrate area. In some embodiments, the outlets are distributed over an area that is the same as or greater than the substrate area. At least a portion of the area is aligned with at least a portion of the substrate area.

A device is also described. The device includes a substrate and a transition metal chalcogen (TMC) film formed on the substrate by vapor deposition. The TMC film covers an area of the substrate of at least one square inch. In some embodiments, the TMC film covers an area of at least four square inches. In some embodiments, the TMC film covers an area of at least twelve square inches. The TMC film may be a two-dimensional film having a thickness of at least one monolayer. In some embodiments, the TMC film is a doped TMC film.

A method is described. The method includes reacting at least a portion of a plurality of precursors in a pre-reaction region to form a modified precursor. The modified precursor is more thermally stable than a metal-containing precursor of at least the portion of the precursors. The modified precursor may have a higher disassociation temperature and/or a longer diffusion length than the metal-containing precursor. The precursors may also include a modifier for the metal-containing precursor. The modified precursor and at least one chalcogen precursor are separately provided to a reaction chamber. The modified precursor and the chalcogen precursor(s) react and form a chalcogen film on a substrate in the reaction chamber.

The method may also include delivering the precursors to the pre-reaction region. The precursors may include a dopant precursor. In such embodiments, the dopant in the dopant precursor is incorporated in the chalcogen film. Thus, a doped chalcogen film is formed on the substrate in the reaction chamber.

Although the system(s), method(s), and device(s) are described in the context of a metal-containing precursor, a dopant precursor, an intermediate precursor, a modifier (as a particular precursor), a chalcogenide precursor, and/or analogous single elements, nothing prevents the use of other, additional, and/or multiple components. For example, multiple metal-containing precursors, multiple dopant precursors, multiple modifiers, and/or multiple chalcogenide precursors might be used. Further, other components may be present. For example, precursors may use a flow of inert gases, such as Ar gas. Various features are present in the embodiments described herein. Other combinations of features not explicitly shown may be possible in some embodiments.

FIG. 1 is a block diagram depicting an embodiment of vapor deposition system 100 for providing a metal chalcogenide material. For clarity, only some portions of vapor deposition system 100 are shown. Vapor deposition system may be a furnace type chemical vapor deposition (CVD) system, a cold wall CVD system, an atomic layer deposition (ALD) system, or another type of vapor deposition system. Vapor deposition system 100 may be used in forming metal chalcogenides, particularly two dimensional (2D) transition metal chalcogenides (TMCs). Thus, vapor deposition system 100 is described in the context of TMCs, particularly 2D TMC films. However, in some embodiments, other metal chalcogenides (2D or otherwise) and/or other films may be fabricated.

Vapor deposition system 100 includes reaction chamber 110 and reactant delivery subsystem 120. Reaction chamber 110 houses substrate 112 on which the TMC is to be grown. For example, reaction chamber 110 may include a substrate holder, a vacuum system, a gas flow system, a temperature control system (e.g. heating and/or cooling) as well as controls for maintaining the desired environment within reaction chamber 110 for growth of the TMC. In some embodiments, reaction chamber 110 may be controlled to maintain a temperature of at least 50° Celsius and not more than 1000° Celsius or not more than 2000° Celsius.

Reactant delivery subsystem 120 provides the reactants for growth of the TMC to reaction chamber 110. Reactant delivery subsystem 120 generates at least some of the reactants from precursors. More specifically reactant delivery subsystem 120 generates some reactants, otherwise termed modified precursors, from some precursors. The modified precursors have improved thermal stability over the corresponding primary precursors. The modified precursors may also have a longer diffusion length than the precursors. As a result, the modified precursors are better able to flow to reaction chamber 110 and form a high quality TMC on substrate 112 over a larger area. For example, reactant delivery subsystem 120 may generate modified precursors and/or modified dopant precursors from metal-containing precursors and/or dopant containing precursors. Reactant delivery subsystem 120 provides other reactants (e.g. chalcogen-containing precursors) directly to reaction chamber 110. However, reactant delivery subsystem 120 separately provides the modified precursors from chalcogen-containing precursors to reaction chamber 110. The modified precursors may flow through separate channels from the chalcogen-containing precursors. Consequently, mixing between the modified precursors and chalcogen-containing precursors outside of reaction chamber 110 may be reduced or eliminated. Formation of a chalcogenide material, such as a 2D TMC film, is thus facilitated.

More specifically, reactant delivery subsystem 120 includes inlets 130, pre-reaction region 140, and outlets 150. Pre-reaction region 140 is coupled with inlets 130 and outlets 150. Inlets 130 are also coupled with outlet 150. Outlets 150 are coupled with reaction chamber 110. Precursors and chalcogen-containing precursors are gaseous (e.g. sublimated via heating and carried by an inert gas flow) and provided to vapor deposition system 100 via inlets 130. Some inlets 130 provide the precursors to pre-reaction region 140. The precursors input to inlets 130 and provided to pre-reaction region 140 include metal-containing precursors and modifiers. Metal-containing precursors include the metal used in forming the chalcogenides (e.g. the transition metal for the 2D TMC films) in reaction chamber 110. Modifiers include precursors that react with the metal-containing precursors in pre-reaction chamber 140 to form modified precursors. In some instances, dopant precursors are also provided to pre-reaction region 140 via inlets 130. Additional precursors, such as carbon-removing precursors that may be different from the modifiers, metal-containing precursors, and dopant precursors, may also be provided to pre-reaction region 140 by inlets 130. Reactions of precursors (e.g. metal-containing precursors, modifiers, and/or dopant precursors) in pre-reaction region 140 takes place in the absence of chalcogen-containing precursors.

Examples of metal-containing precursors provided to pre-reaction region 140 include single metal species and/or metal dimer species for the desired metal(s) for the chalcogenide(s) being fabricated. Such metal-containing precursors may include W and/or Mo for a 2D TMC film. For example, metal-containing precursors may include but are not limited to: $Mo(CO)_6$, $Mo(CO)_{6-x}Br_x$, $W(CO)_6$, $WCl_6$, $MoCl_6$, $WF_6$, $MoF_6$, $(\eta^5-C_5H_4CH_3)_2Mo_2(CO)_6$, Methylcyclopentadienylmolybdenum tricarbonyl dimer (or other alkyl-cp derivatives; e.g. methylcyclopentadienylmolybdenum tricarbonyl dimer or propylcyclopentadienylmolybdenum tricarbonyl dimer), $(\eta^5-C_5H_5)_2Mo_2(CO)_6$ (the carbonyl group may be substituted by cyanide or $PPh_3$ group), $(\eta^5-C_5H_5)_2Mo_2(CO)_4(\mu-\eta^2-CH_3CHO)$, $(\eta^5-C_5H_5)_2Mo_2(CO)_4$ ($\mu$-dppm); dppm: 1,1-Bis (diphenylphosphino) methane, $Mo_2(hpp)_4$, bpp: hexahydropyrimidopyrimidine, $Mo_2$ $(tmtaa)_2$; tmtaa: tetramethyltetraazaannulene, $(\eta^5-C_5H_5)_2Mo_2(CO)_2(\mu-SCF_3)_2$, $Mo_2Cl_4(bdppp)_2$; bdppp: 2,6-bis(diphenylphosphino)pyridine, and $Mo_2(CO)(\eta^5-C_5H_5)_2(\mu-C_4(C_6H_5)_4)$.

Modifiers may react with the metal-containing precursors and/or the dopant precursors. Modifiers are part of the precursors provided to pre-reaction region 140. For example, $H_2O$ (e.g. water vapor) may be used as a modifier to react with other precursors in pre-reaction region 140. Other examples of modifiers include but are not limited to $Cl_2$, $Br_2$, $I_2$, $O_2$, $H_2O_2$, $O_3$, HCl, HBr, HI, NaCl, NaBr, and/or alkali-ion containing salt/compounds. For example the reaction of chlorine with $Mo(CO)_6$ is $Mo(CO)_6+$ $HCl \rightarrow Mo(CO)_{6-x}Cl_x$. Other reactions of metal-containing precursors may include but are not limited to: $Mo(CO)_6+$ $(\eta_5-C_5H_4CH_3) \rightarrow (\eta_5-C_5H_4CH_3)_2Mo_2(CO)_6$ and $(\eta_5-C_5H_4CH_3)_2Mo_2(CO)_6+(\eta_5-C_5H_4CH_3)_2W_2(CO)_6 \rightarrow (\eta_5-C_5H_4CH_3)_3-W-Mo(CO)_3(\eta_5-C_5H_4CH_3)$. Some precursors, such as water, perform multiple functions. For example, in addition to its use as a modifier, water may be used to mitigate carbon residue in vapor deposition system 100. Other and/or additional modified precursors, modifiers, reactions, and/or metal-containing precursors may be possible.

Dopant precursors are used to incorporate dopants into the TMC film being formed. Such dopant precursors are provided to pre-reaction region 140. The dopant precursors mix with the remaining precursors (e.g. metal-containing precursors and modifiers) and may undergo a reaction. A modified dopant precursor may thus be formed. Dopant precursors may have the form $M(CO)_6$ and/or $M(\eta^5-C_5H_5)_2$, where M represents the transition metal dopant. For example, $Fe(CO)_5$, $Nb_2(CO)_{12}$, $Re_2(CO)_{10}$, $Ni(CO)_4$, $Ti(CO)_6$, $V(CO)_6$, and/or $Fe(\eta^5-C_5H_5)_2$ might be used as dopant precursors. One or more of the organic ligands CO may also be replaced by other aliphatic or aromatic structures. For example, the dopant precursor $Fe(CO)_5$ may react in pre-reaction region 140 to form a more stable dimer as a modified dopant precursor. For example, Fe-Mo or Fe-W dimer systems may be formed. An example of such a reaction is $Fe(CO)_5+2$ $(\eta_5-C_5H_5) \rightarrow (\eta_5-C_5H_5)_2Fe_2(CO)_4$. Another such reaction may form a metal dimer with the primary precursor. An example of such a reaction is $(\eta^5-C_5H_5)_2Fe_2(CO)_4$ $(\eta^5-C_5H_5)_2Mo_2(CO)_6 \rightarrow 2[(\eta^5-C_5H_5)_2 (CO)_2Fe-Mo(CO)_3(\eta^5-C_5H_5)]$. Thus, Fe and/or other metal dopants may be added in the formation of TMCs.

Other precursors could be provided to pre-reaction region 140. For example, some precursors are used in carbon removal. Such precursors may include $H_2O$, $O_2$, $H_2$, $O_3$, and/or $H_2O_2$. The above-identified metal-containing precursors, modifiers, dopant precursors, and carbon removal precursors are not intended to be an exhaustive list. Instead, such precursors are for exemplary purposes only.

Chalcogen-containing precursors are also provided to reactant delivery subsystem 120 via inlets 130. Chalcogen-containing precursors may include S, Se, and/or Te. For example, chalcogen-containing precursors may include but are not limited to $H_2S$, sulfur powder, dimethyl sulfide (DMS), $CS_2$, diethyl sulfide (DES) and/or $H_2Se$.

Pre-reaction region 140 and inlets 130 are coupled with outlets 150. Outlets 150 provide the modified precursors, chalcogen-containing precursors, and/or other precursors (e.g. modifiers, dopant precursors, modified dopant precursors, and/or carbon removal precursors) to reaction chamber 110. Within reactant delivery subsystem 120, the flow of vapor from pre-reaction region 140 is separate from the flow of chalcogen-containing precursors from inlets 130. Thus, outlets 150 separately provides modified precursor(s) and chalcogen-containing precursor(s) to reaction chamber 110. Reaction chamber 110 is configured such that the modified precursor(s) and chalcogen-containing precursor(s) mix and react, forming a TMC on substrate 112. If dopant precursors are provided to reactant delivery subsystem 120, a doped TMC is formed on substrate 112.

In operation, precursors are provided via inlets 130 to pre-reaction region 140. These precursors include at least a metal-containing precursor and a modifier. Dopant precursor(s) and/or carbon removing precursor(s) may also be provided to pre-reaction region 140. In pre-reaction region 140, the metal-containing precursor and modifier react to form a modified precursor. Thus, pre-reaction region 140 is configured to facilitate this reaction. In some embodiments, pre-reaction region 140 is heated, for example to at least 50° Celsius and not more than 1000° Celsius. In some embodiments, pre-reaction region 140 is heated near, to, or above the disassociated temperature of the metal-containing precursor (e.g. over 100° Celsius, over 150° Celsius, or over 200° Celsius). The precursors may also be exposed to a plasma in pre-reaction region 140. The modified precursor formed is more thermally stable than the metal-containing precursor. For example, if the metal-containing precursor has a disassociation temperature of 120° Celsius, the modified precursor might have a disassociation temperature of at least 400° Celsius, at least 600° Celsius, or more. Other ranges of disassociation temperature are possible. In general, the disassociation temperature of the modified precursor is desired to be sufficiently high that flow of the modified precursor from pre-reaction chamber 140 to reaction chamber 110 is facilitated. The modified precursor formed may also have a higher diffusion length than the metal-containing precursor. For example, $Mo(CO)_6$ may have a diffusion length of approximately 70 micrometers. The corresponding modified precursor, $Mo(CO)_{6-x}(OH)_x$, may have a diffusion length of greater than 500 micrometers at one atmosphere pressure and at a temperature of approximately 800° Celsius. In some embodiments, the modified precursor has a diffusion length on the order of one thousand multiplied by the diffusion length of the metal-containing precursor from which the modified precursor is formed. However, the temperature of pre-reaction region 140 is also controlled to remain at or below the disassociation temperature of the modified precursor. In embodiments in which a dopant precursor is provided to pre-reaction chamber 140, the dopant precursor may react with the metal-containing precursor, modifier, and/or modified precursor. The resulting reactants are output from pre-reaction region 140.

The modified precursor is provided from pre-reaction region 140 to outlets 150. A chalcogen-containing precursor is also provided from inlets 130 to outlets 150. Outlets 150 provide the modified precursor and chalcogen-containing precursor to reaction chamber 110. However, outlets 150 are also configured such that the modified precursor remains separate from the chalcogen-containing precursor while within reactant delivery subsystem 120. In some embodiments, therefore, the modified precursor and chalcogen-containing precursor do not mix until leaving outlets 150 (and thus reactant delivery subsystem 120). In addition, outlets 150 and any path between pre-reaction region 140, inlets 130, and outlets 150 may be temperature controlled to facilitate the reactants (e.g. modified precursor, chalcogen-containing precursor, and/or any dopant precursor/modified dopant precursor) reaching reaction chamber 110. For example, the temperature may be controlled to be sufficiently high that the reactants are unlikely to condense, sufficiently high that the desired temperatures of reaction chamber 110 may be maintained, and sufficiently low that the reactants are unlikely to dissociate or otherwise rendered inoperable.

The modified precursor and chalcogen-containing precursor mix and react in reaction chamber 110. Thus, reaction chamber 110 is configured to form the TMC. For example, the reaction chamber 110 may be heated to a temperature of at least 50° Celsius. In some embodiments, the temperature of reaction chamber 110 is controlled to be less than 2000° Celsius or not more than 1000° Celsius. For example, reaction chamber 110 may have a temperature of at least 400° Celsius and not more than 1000° Celsius. In some instances, the temperature of reaction chamber 110 is at least 600° Celsius and does not exceed 900° Celsius. In some embodiments, the temperature of pre-reaction region 140 used to form the modified precursors is less than the temperature(s) used in reaction chamber 110 for the formation of chalcogenides. However, in some instances, the temperature of pre-reaction chamber 140 during use may be higher than the temperature of reaction chamber 110 during use. For example, pre-reaction region 140 may operate at approximately 600° Celsius, while reaction chamber 110 may operate at approximately 300-400° Celsius. However, in such instances, the quality of the TMC film may be poorer than the quality of TMC films grown at high temperature (e.g. says 1000° Celsius).

Substrate 112 is also oriented in reaction chamber 110 to facilitate growth of the TMC. For example, substrate 112 may be at least five millimeters and not more than 100 millimeters (and in some embodiments not more than fifty millimeters) from outlets 150. In some embodiments, the surface of substrate 112 is parallel or close to parallel (e.g. within five degrees of parallel) to the surface of outlets 150. Other orientations and/or distances are possible. If a dopant precursor was provided to pre-reaction region 140, then the resulting reactant including the dopant is also provided to reaction chamber 110 via outlets 150. In such cases, a doped TMC film is grown.

For example, metal-containing precursor $Mo(CO)_6$ may be provided to pre-reaction region 140 via inlets 130. This may occur by heating $Mo(CO)_6$ and flowing an inert gas, such as Ar, through the heated Mo(CO) 6. In addition, water vapor may be provided to pre-reaction region 140 via inlets 130 as a modifier and carbon mitigation precursor. In pre-reaction region 140, the $Mo(CO)_6$ and $H_2O$ react to form $Mo(CO)_{6-x}(OH)_x$ as a modified precursor. $Mo(CO)_{6-x}(OH)_x$ has a higher degradation temperature and a higher diffusion distance than $Mo(CO)_6$. Consequently, this modified precursor is more likely to reach reaction chamber 110 and be capable of forming a TMC. Reactions of the water vapor may also aid in clearing carbon residue in pre-reaction region 140, before such carbon residue reaches reaction chamber 110. The modified precursor is provided to reaction chamber 110 via outlets 150. A chalcogen-containing precursor such as $H_2S$ is provided to reaction chamber 110 through inlets 130 and outlets 150. In some embodiments, dopant precursors and/or carbon removers may be provided to reaction chamber 110 through inlets 130 and outlets 150. Reaction chamber 110 may also be heated, for example to 600° Celsius-800° Celsius. The modified precursor and chalcogen-containing precursor react in reaction chamber 110, forming $MoS_2$ on substrate 112. Although described in the context of a single metal-containing precursor, modifier, and chalcogen-containing precursor, multiple metal-containing precursors, modifiers, and chalcogen-containing precursors may be used. Thus, mixed TMC films (e.g. $Mo_xW_yS_2$ and/or $Mo_xW_ySe_2$) might be fabricated. Further, dopant precursor(s) may be provided to pre-reaction chamber 140. Such dopants may be more readily incorporated into a TMC film than if the dopant is provided directly to reaction chamber 110. In addition, the uniformity and desired amount of the dopant in the TMC film may be better achieved. However, in other embodiments, dopant precursor(s) and/or carbon removers may be provided directly to reaction chamber 110.

Vapor deposition system 100 may facilitate growth of materials, such as 2D TMC films. The modified precursor formed may be more stable and/or have a longer diffusion length than the metal-containing precursor. For example, $Mo(CO)_{6-x}(OH)_x$ may have disassociation temperatures greater than the 120° Celsius disassociation temperature for $Mo(CO)_6$. The diffusion length of $Mo(CO)_{6-x}(OH)$, may also be larger than the diffusion lengths for $Mo(CO)_6$ (e.g. greater than a centimeter to a few centimeters). The modified precursor may thus be more volatile. These properties allow for higher usage efficiency. In particular, the modified precursor may be less likely to be disassociated or otherwise adversely affected by the transfer from inlets 130 to reaction chamber 110. A larger fraction of the modified precursor reaches reaction chamber 110 and is incorporated into the TMC film. The formation of modified precursors in pre-reaction region 140 also allows for the fabrication of new precursors for use in reaction chamber 110 that are not readily obtainable commercially. Flexibility of vapor deposition system 100 may thus be improved. In addition, a wider working temperature range (e.g. 150° Celsius through 1000° Celsius or higher) may be achieved for vapor deposition system 100. Consequently, robustness against temperature variations and flexibility of fabrication of 2D TMC films may be improved. System 100 may also be more readily adapted to different growth requirements. The dopant may also be provided via dopant precursors for pre-reaction region 140. The dopant precursors may be provided in a fraction analogous to that desired for the dopant in the TMC being fabricated. Thus, reliable, more controllable doping of TMCs may be provided. A carbon remover such as water (which may also be used as a modifier) can be provided as a precursor to pre-reaction region 140. In the example above, water may be both a modifier and a carbon remover. Consequently, carbon may be reduced at pre-reaction chamber 140 and the quality of TMCs grown improved. The modified precursor and chalcogen-containing precursor are also separated until provided to reaction chamber 110 via outlets 150. Thus, growth of the TMC film may be limited to reaction chamber 110. Outlets 150 may be distributed such that the uniform seeding and growth across a large area of substrate 112 are achieved. Thus, a 2D TMC film having a larger area may be able to be grown. For example, in some embodiments, the film might be at least 1 in$^2$ in area. In some embodiments, the TMC film may be at least 2 in$^2$, at least 8 in$^2$, at least 12 in$^2$ or at least 20 in$^2$ in area. In some instances, 2D TMCs having a large area, thicknesses of one monolayer through one hundred micrometers (or more), and a low defect density (e.g. fewer vacancies) may be grown. For example, 2D TMC films fabricated using system 100 may result in films that not only have larger areas, but also a lower defect density than conventionally formed 2D TMC films (e.g. $10^{11}$ defects/cm$^2$ as compared to $10^{13}$ defects/cm$^2$ for 2D TMC films fabricated using conventional techniques). By introducing a pre-reaction region 140, the initial reaction that forms the modified precursors is isolated from reaction chamber 110. This may reduce potential contamination, optimize the use of precursors and aid the production of higher-quality TMCs. Thus, large area, electronic grade metal chalcogen (e.g. TMC) films may be provided. Consequently, a variety of 2D TMC films having higher quality may be more readily fabricated using vapor deposition system 100.

Figure 2:
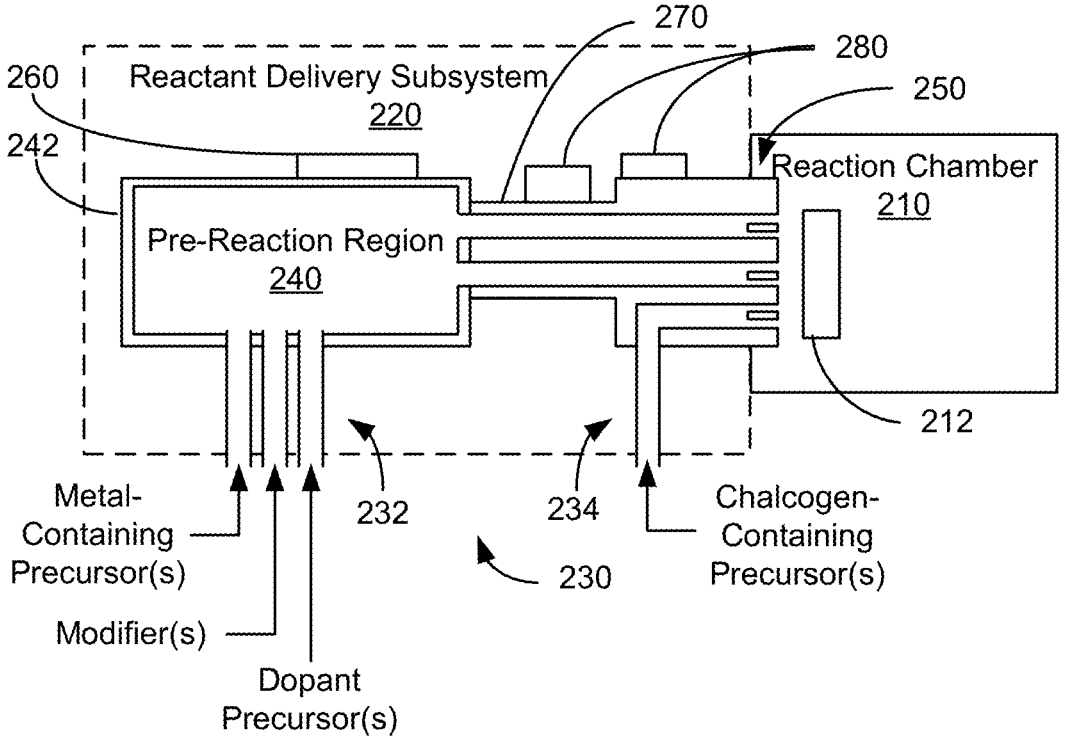
FIG. 2 is a diagram depicting an embodiment of a vapor deposition system for providing a metal chalcogenide material.

FIG. 2 is a diagram depicting an embodiment of vapor deposition system 200 for providing a metal chalcogenide material. FIG. 2 is not to scale and not all components may be shown. Vapor deposition system 200 is analogous to vapor deposition system 100. Consequently, analogous components are labeled similarly. Vapor deposition system 200 is described in the context of TMCs, particularly 2D TMC films. However, in some embodiments other metal chalcogenides (2D or otherwise) and/or other films may be fabricated.

Vapor deposition system 200 includes reaction chamber 210 having substrate 212 and reactant delivery subsystem 220 that are analogous to reaction chamber 110 and reactant delivery subsystem 120. Reactant delivery subsystem 220 includes inlets 230, pre-reaction region 240, and outlets 250 that are analogous to inlets 130, pre-reaction region 140, and outlets 150, respectively.

Inlets 230 include precursor inlets 232 and chalcogen-containing precursor inlets 234. Inlets 232 are connected to and provide precursors to pre-reaction region 240. Inlets 234 are coupled with and provide the chalcogen-containing precursor to outlets 250. Pre-reaction region 240 is within pre-reaction chamber 242 and includes temperature control unit 260. Temperature control unit 260 may, for example, include a heater.

Reactant delivery subsystem 220 also includes channels 270 and temperature control unit 280. Channels 270, temperature control unit 280, and outlets 250 may be considered to form a temperature controlled gas distribution unit. Temperature control unit 280 may be used to control the temperature of modified precursors and other reactants prior to entering reaction chamber 210 via outlets 250. For example, the temperature in reactant delivery subsystem 220 (e.g. in channels 270) may be controlled to be sufficiently high that reactants do not condense and sufficiently low that the reactants do not disassociate or otherwise become destroyed. Channels 270 allow for the flow of reactants from pre-reaction region 240 to outlets 250. Thus, pre-reaction region 240 may be separated from outlets 250 by a distance.

Outlets 250 are distributed across some or all of the surface of substrate 212. In some embodiments, outlets 250 are evenly distributed. In some embodiments, outlets 250 from channels 270 from pre-reaction region 240 have a different size than outlets 250 for chalcogen-containing precursors. Although outlets 250 from channels 270 are shown as concentrated in one region and outlets 250 from inlets 234 are shown as concentrated in another region, in some embodiments, outlets 250 carrying gases from channels 270 and inlets 234 are distributed in another manner. For example, outlets 250 carrying gases from channels 270 and inlets 234 may be evenly distributed. In some embodiments, outlets 250 are distributed across an area that is near or greater than the surface of substrate 212. For example, outlets 250 may be distributed across an area that is at least ½ of the substrate area, at least ¾ of the substrate area, approximately equal to the substrate area, or greater than the substrate area (e.g. not more than 1½ the substrate area or not more than twice the substrate area). Further, outlets 250 are aligned with some or all of substrate 212. Thus, growth of a uniform 2D TMC film across a larger area may be facilitated.

Vapor deposition system 200 operates in an analogous manner to and may share the benefits of vapor deposition system 100. Vapor deposition system 200 may facilitate growth of materials, such as 2D TMC films. The modified precursor formed in pre-reaction region 240 may be more stable and/or have a longer diffusion length than the metal-containing precursor. The modified precursor may be less likely to be disassociated or otherwise adversely affected by the transfer from pre-reaction chamber 242 to reaction chamber 210. A larger fraction of the modified precursor reaches reaction chamber 210 and can be used for TMC formation, allowing for higher usage efficiency. The formation of modified precursors in pre-reaction region 240 also allows for the fabrication of new precursors for use in reaction chamber 210 that may not be obtainable commercially. Flexibility of vapor deposition system 200 may thus be improved. In addition, a wider working temperature range (e.g. 150° Celsius through 1000° Celsius or higher) may be achieved for vapor deposition system 200. Consequently, robustness against temperature variations, adaptability to new growth requirements, and flexibility of fabrication of 2D TMC films may be improved. The dopant may also be provided via dopant precursors for pre-reaction region 240. Thus, reliable, more controllable doping of TMCs may be attained. A carbon remover can be provided as a precursor to pre-reaction region 240. Consequently, carbon may be reduced at pre-reaction chamber 242 and the quality of TMC films grown improved. The modified precursor and chalcogen-containing precursor are also separated until provided to reaction chamber 210 via outlets 250. Outlets 250 may be distributed such that the uniform seeding and growth across a large area of substrate 212 are achieved. Thus, a more uniform 2D TMC film having a larger area may be able to be grown. In some instances, 2D TMCs having a large area, thicknesses of one monolayer through one hundred micrometers (or more), and a low defect density (e.g. few or no vacancies) may be grown. Such 2D TMC films may be suitable for electronic applications. Consequently, a variety of 2D TMC films having higher quality may be more readily fabricated using vapor deposition system 200.

Figure 3:
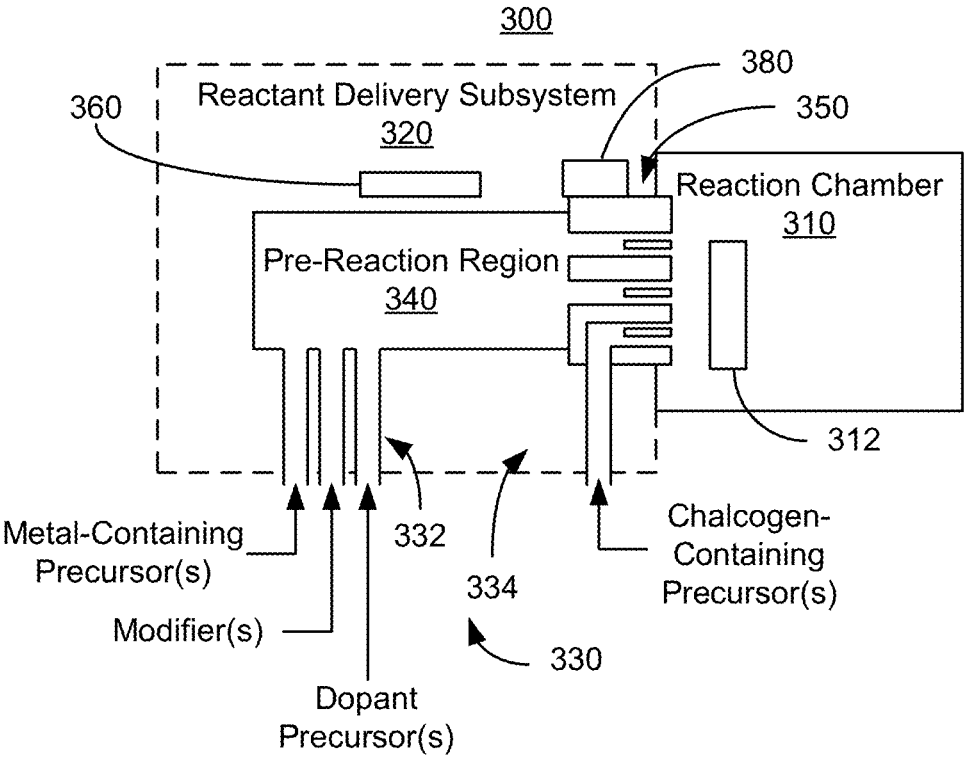
FIG. 3 is a diagram depicting an embodiment of a vapor deposition system for providing a metal chalcogenide material.

FIG. 3 is a diagram depicting an embodiment of vapor deposition system 300 for providing a metal chalcogenide material. FIG. 3 is not to scale and not all components may be shown. Vapor deposition system 300 is analogous to vapor deposition systems 100 and/or 200. Consequently, analogous components are labeled similarly. Vapor deposition system 300 is described in the context of TMCs, particularly 2D TMC films. However, in some embodiments other metal chalcogenides (2D or otherwise) and/or other films may be fabricated.

Vapor deposition system 300 includes reaction chamber 310 having substrate 312 and reactant delivery subsystem 320 that are analogous to reaction chamber 110 and reactant delivery subsystem 120. Reactant delivery subsystem 320 includes inlets 330, pre-reaction region 340, and outlets 350 that are analogous to inlets 130, pre-reaction region 140, and outlets 150, respectively.

Inlets 330 include precursor inlets 332, which are connected to and provide precursors to pre-reaction region 340, and chalcogen-containing precursor inlets 334. Pre-reaction region 340 is within reactant delivery subsystem 320 and includes temperature control unit 360. Although depicted as adjacent to pre-reaction region 340, temperature control unit 360 may be or include a portion closer to inlets 332. Temperature control unit 360 may, for example, include a heater and/or coolant. For example, temperature control unit 360 may include a cooling unit proximate to inlets 332 and a heater adjacent to pre-reaction region 340.

Reactant delivery subsystem 320 also includes temperature control unit 380. Temperature control unit 380 may be used to control the temperature of modified precursors and other reactants prior to entering reaction chamber 310 via outlets 350. For example, the temperature in reactant delivery subsystem 320 may be controlled to be sufficiently high that reactants do not condense (e.g. to prevent or mitigate clogging of reactant delivery subsystem 320), sufficiently high that the desired temperature of the reactants may be maintained in reaction chamber 310, and sufficiently low that the reactants do not disassociate or otherwise become destroyed. Outlets 350 are distributed across some or all of the surface of substrate 312 in a manner analogous to outlets 250. For example, outlets 350 carrying gases from pre-reaction region 340 and inlets 334 may be evenly distributed. In addition, outlets 350 may be distributed across an area that is near or greater than the surface of substrate 312.

As indicated in FIG. 3, pre-reaction region 340 is proximate to outlets 350 and, therefore, to reaction chamber 310. In some embodiments, therefore, outlets 350 and pre-reaction region 340 may be integrated into a component that both forms the modified precursors, accepts the dopant precursors, and provides the reactants to reaction chamber 310.

Vapor deposition system 300 may share the benefits of vapor deposition system 100. Vapor deposition system 300 may facilitate growth of materials, such as 2D TMC films. The modified precursor formed may be more stable and/or have a longer diffusion length than the metal-containing precursor. The modified precursor may be less likely to be disassociated or otherwise adversely affected by the transfer to reaction chamber 310. A larger fraction of the modified precursor reaches reaction chamber 310 and can be used for TMC formation, allowing for higher usage efficiency. The formation of modified precursors in pre-reaction region 340 also allows for the fabrication of new precursors for use in reaction chamber 310 that may not be obtainable commercially. Flexibility of vapor deposition system 300 may thus be improved. In addition, a wider working temperature range (e.g. 150° Celsius through 1000° Celsius or higher) may be achieved for vapor deposition system 300. Consequently, robustness against temperature variations, adaptability to new growth requirements, and flexibility of fabrication of 2D TMC films may be improved. The dopant may also be provided via dopant precursors for pre-reaction region 340. Thus, reliable, more controllable doping of TMCs may be provided. A carbon remover can be provided as a precursor to pre-reaction region 340. Consequently, carbon may be reduced at pre-reaction chamber 340 and the quality of TMCs grown improved. The modified precursor and chalcogen-containing precursor are also separated until provided to reaction chamber 310 via outlets 350. Outlets 350 may be distributed such that the desired (e.g. uniform) seeding and growth across a large area of substrate 312 are achieved. Thus, a more uniform 2D TMC film having a larger area may be able to be grown. In some instances, 2D TMCs having a large area, thicknesses of one monolayer through one hundred micrometers (or more), and a low defect density (e.g. fewer vacancies) may be grown. For example, 2D TMC films grown using system 300 may have defects per unit area that are approximately two orders of magnitude less than for conventionally grown 2D TMC films (e.g. $10^{11}$ defects/cm$^2$ for some TMC films grown using an embodiment of system 300 as opposed to $10^{13}$ defects/cm$^2$ for some TMC films grown using conventional techniques). Consequently, a variety of 2D TMC films having higher quality may be more readily fabricated using vapor deposition system 300.

Figure 4A:
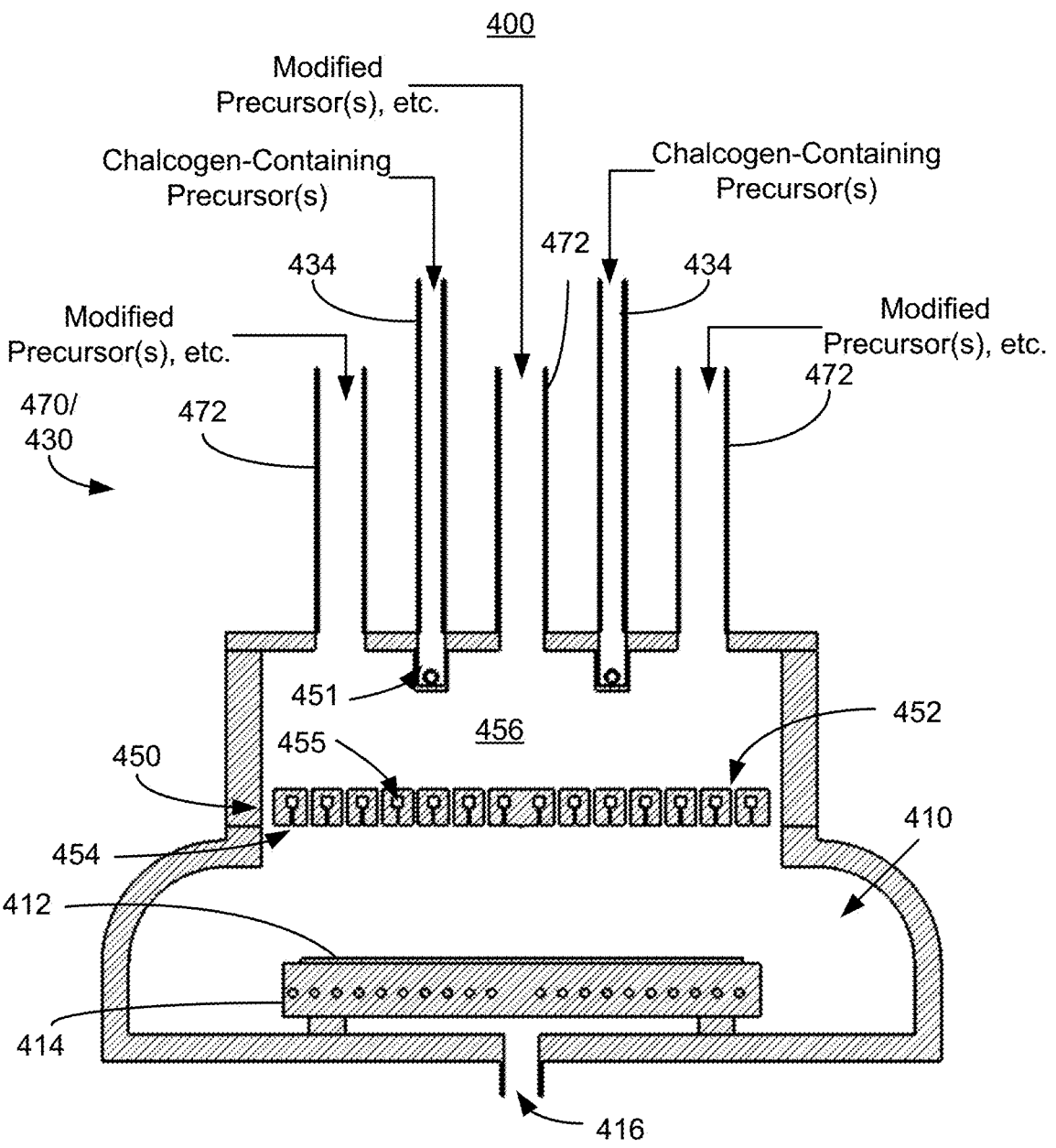
FIGS. 4A-4D are diagrams depicting a portion of a vapor deposition system for providing a metal chalcogenide material.
Figure 4B:
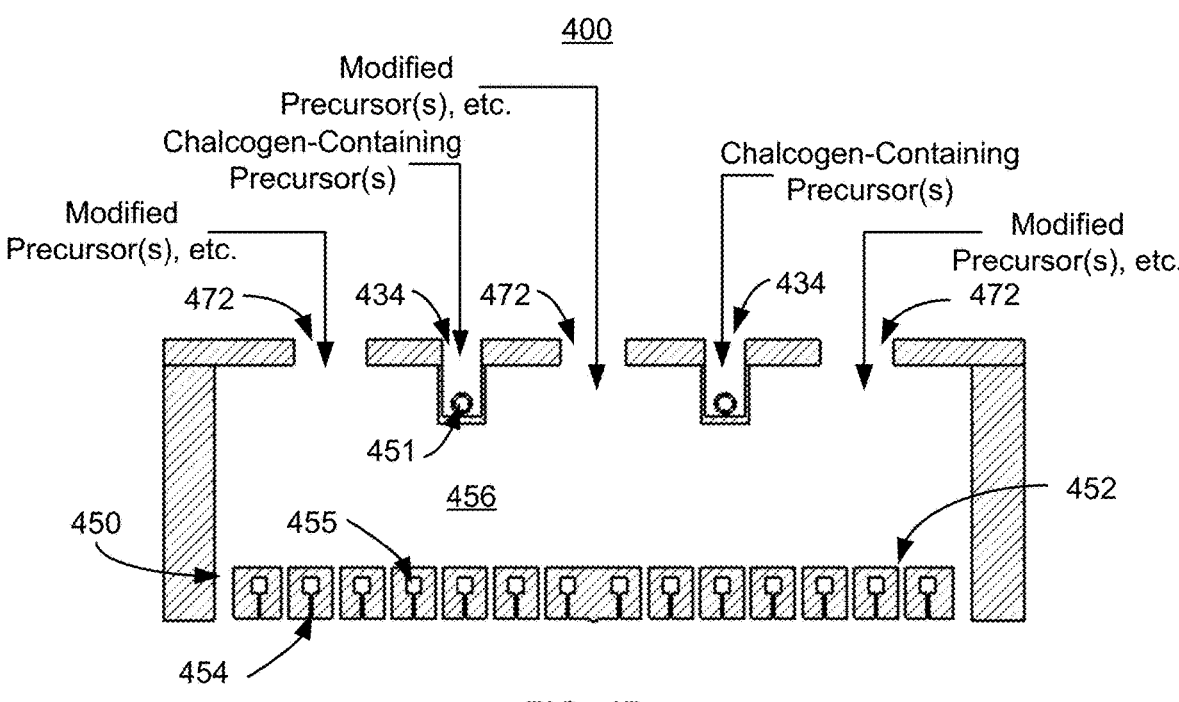
Figure 4C:
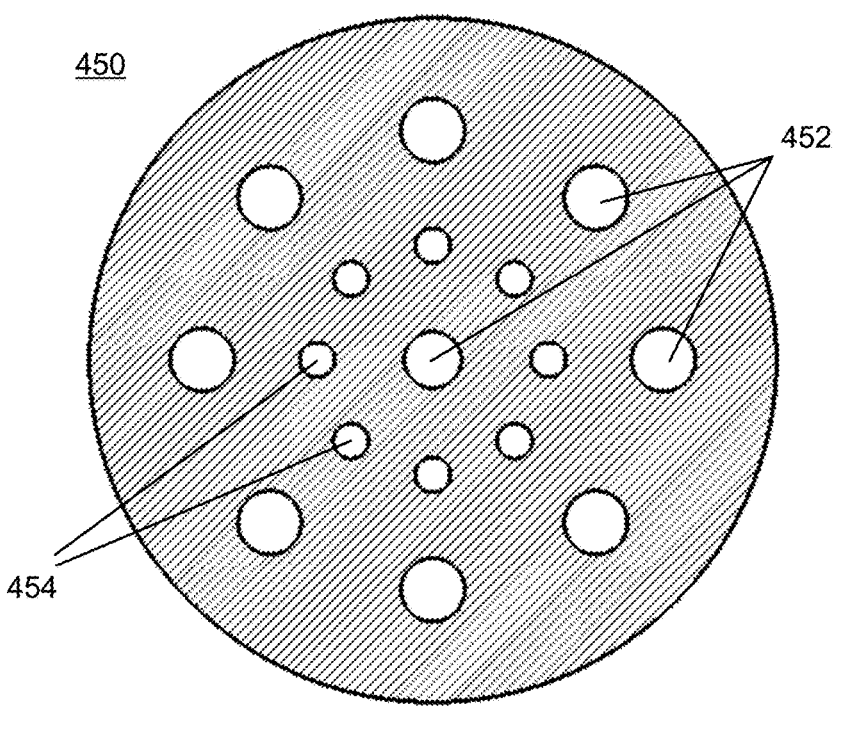
Figures 4D, 5:
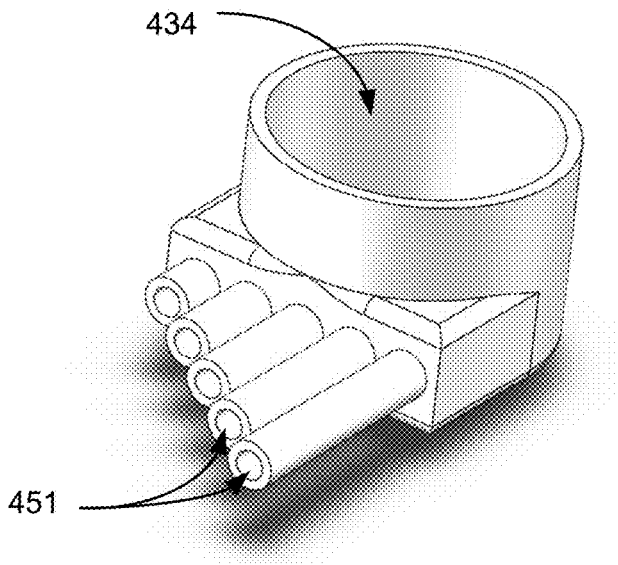
FIG. 5 is a diagram depicting an embodiment of a gas distribution system for a vapor deposition system usable in fabricating a metal chalcogenide material.

FIGS. 4A-4D are diagrams depicting a portion of vapor deposition system 400 usable in forming TMC films. FIGS. 4A-4D are not to scale and not all components may be shown. Vapor deposition system 400 is analogous to vapor deposition systems 100, 200, and/or 300. Vapor deposition system 400 is described in the context of TMCs, particularly 2D TMC films. However, in some embodiments other metal chalcogenides (2D or otherwise) and/or other films may be fabricated. FIG. 4A depicts a cross-sectional view of the distribution unit and reaction chamber 410. FIG. 4B depicts a portion of system 400. FIG. 4C depicts outlets 450, which take the form of a plate 450 having apertures 452 and 454 therein. FIG. 4D is a perspective view of a portion of the connection between inlets 434 and apertures 455. The materials used in system 400 are desired to be high-temperature resistant. For example, stainless steel, quartz, graphite, Ni, and/or Ni alloys may be used to form various portions of system 400.

Vapor deposition system 400 may be most analogous to vapor deposition system 200, which includes a temperature controlled distribution unit including channels 270 between pre-reaction region 240 and outlets 250. Consequently, analogous components are labeled similarly. Vapor deposition system 400 includes reaction chamber 410 having substrate 412 and a reactant delivery subsystem including channels 470, inlets 434, and outlets 450 that are analogous to reaction chambers 110 and 210 and reactant delivery subsystems 120 and 220 including channels 270, inlets 234, and outlets 150 and 250. In some embodiments, the pre-reaction chamber of vapor deposition system 400 is not shown, but provides reactants to mixing chamber 456 via channels 472. In other embodiments, precursors (e.g. metal-containing precursor(s), modifiers, dopant precursor(s), and/or other precursors) may be provided to chamber 456. In such embodiments, chamber 456 may function as a pre-reaction region.

Reaction chamber 410 includes substrate holder 414 and outlet vent 416. Inlets 434 carry chalcogen-containing precursor(s). Inlets 434 terminate near passages 451, which carry the chalcogen-containing precursor(s) to regions 455 and apertures 454. Channels 472 carry reactants, such as modified precursor(s), from the pre-reaction region (not shown). The reactants from channels 472 are provided to mixing chamber 456, then output via apertures 452 in plate 450.

In some embodiments, plate 450 includes a series of concentric inner and outer apertures (or passages) 452 and 454. Some apertures 452 carry the modified precursor and other reactants (e.g. for dopants) from mixing chamber 456. Other apertures 454 carry the chalcogen-containing precursor. Apertures 452 and 454 are configured such that reactants from chamber 456 (e.g. the modified precursor) and the chalcogen-containing precursor are separately and evenly distributed over substrate 412 in reaction chamber 410. The reactants from the pre-reaction chamber (e.g. the modified precursor) and the chalcogen-containing precursor meet only when/after flowing out of apertures 452 and 454 and come close to the surface of substrate 412. Thus, the desired (e.g. uniform) seeding and growth across a large area of substrate 412 may be facilitated.

In operation, chamber 456 outputs modified precursor(s) via apertures 452. Dopant precursors (or modified dopant precursors), and/or other reactants may also be provided from chamber 456 via apertures 452. Chalcogen-containing precursor(s) flow toward plate 450 from separate inlets 434. More specifically, chalcogen-containing precursor(s) flow through inlets 434, through passages 451 to passageways 455 and out of plate 450 through apertures 454. Thus, 434/451/455/454 and 472/456/452 form separate, isolated pathways for the chalcogen-containing precursors and the reactants for mixing chamber 456. Pathways 434/451/455/454 and 472/456/452 may be considered part of a gas distribution system that may be capable of independently controlling reactants from pre-reaction region 640 and the chalcogen-containing precursor. In some embodiments, the gas flows through pathways 472/456/452 are separately controlled from the gas flows through pathways 434/451/455/454. In some embodiments, each of pathways 434/451/455/454 has a separately controllable flow. Similarly, each of pathways 472/456/452 may have a separately controllable flow.

The modified precursor and other reactants from chamber 456 flowing through apertures 452 and the chalcogen-containing precursor flowing through apertures 454 mix in reaction chamber 410. Thus, a 2D TMC film may be formed on substrate 412. Uniform seeding and growth across a large area of substrate 412 may be facilitated by the distribution and size of the area of apertures 452 and 454.

Vapor deposition system 400 may share the benefits of vapor deposition systems 100, 200, and/or 300. Vapor deposition system 400 may facilitate growth of a more uniform 2D TMC film having a larger area. Consequently, a variety of 2D TMC films having higher quality may be more readily fabricated using vapor deposition system 400.

FIG. 5 is a diagram depicting an embodiment of a gas distribution system 500 for a vapor deposition system usable in fabricating a metal chalcogenide material. Gas flow control system 500 may be used with vapor deposition systems 100, 200, 300, 400, and/or 600. Other gas flow control systems might be used in other embodiments.

Gas distribution system 500 includes chalcogen-containing gas flow subsystem 510 and precursor flow subsystem 520. Gas flow subsystem 510 is isolated from and independently controlled from gas flow subsystem 520. In gas flow subsystem 520, the flow of dopant precursor, metal-containing precursor, and dopant precursor may be separately controlled. In some embodiments, the carrier gas used for gas flow control systems 510 and 520 is an inert gas, such as Ar. In some embodiments, other and/or additional carrier gases may be used. In some embodiments, additional chalcogen sources and dopant sources may be used. (in the case of using multiple chalcogen sources and/or dopants). Although gas distribution system 500 is depicted with a single line from gas flow subsystem 520 providing the chalcogen-containing precursor and a single line from gas flow subsystem 510 for the precursors (e.g. a single line for the metal-containing precursor, the modifier, and the dopant precursor), multiple lines and multiple control systems may be present. For example, gas flow subsystem 520 might have line(s) for the metal-containing precursor(s), line(s) for the modifier(s), and line(s) for the dopant precursor. Further, a single precursor (e.g. the metal-containing precursor or the chalcogen containing precursor) might have multiple lines and multiple control subsystems (e.g. multiple valves, mass flow controllers, and/or carrier gases). In some embodiments, therefore, gas distribution system 500 may provide a significant degree of control over the reactants.

Through the use of valves, carrier gases, and lines shown, gas distribution system 500 allows for independent control of each precursor. In some embodiments, gas distribution system 500 may provide additional control over outlets (e.g. apertures 452 and/or 454), inlets (e.g. 232 and 234), and/or other regions of the vapor deposition system (e.g. channels 270) to further control the flow of reactants to the substrate.

Gas distribution system 500 facilitates the use of vapor deposition systems 100, 200, 300, 400, and/or 600. Further, gas flow system 500 may be scalable to higher gas flows and/or larger substrate (and thus TMC film) areas.

Figure 6A:
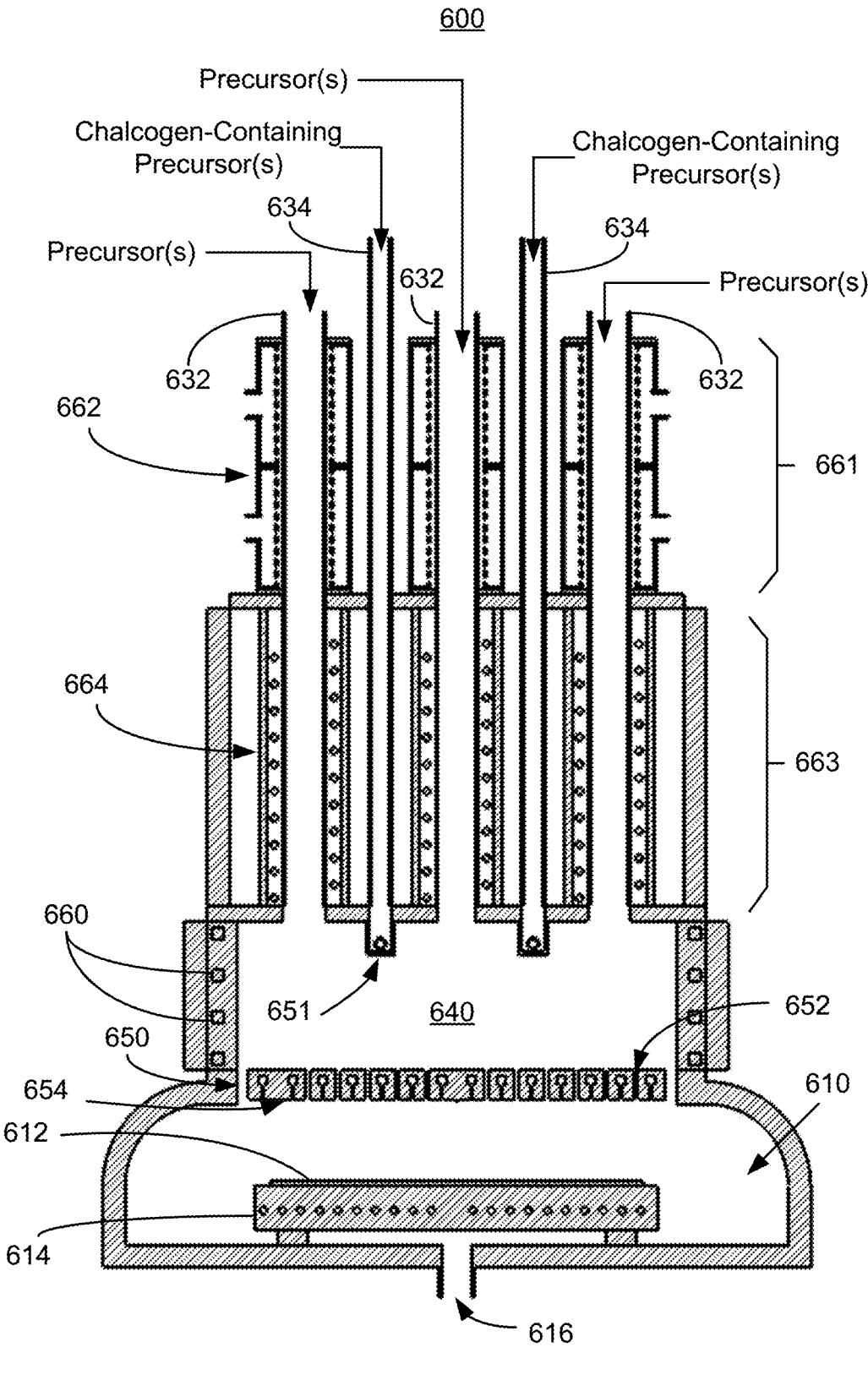
FIGS. 6A-6D are diagrams depicting an embodiment of a vapor deposition system usable in fabricating a metal chalcogenide material.
Figure 6B:
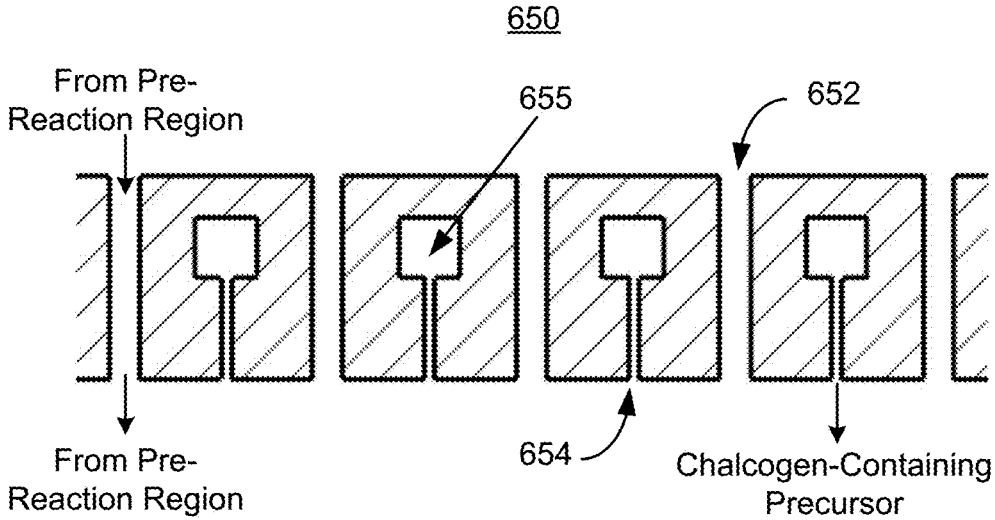
Figure 6C:
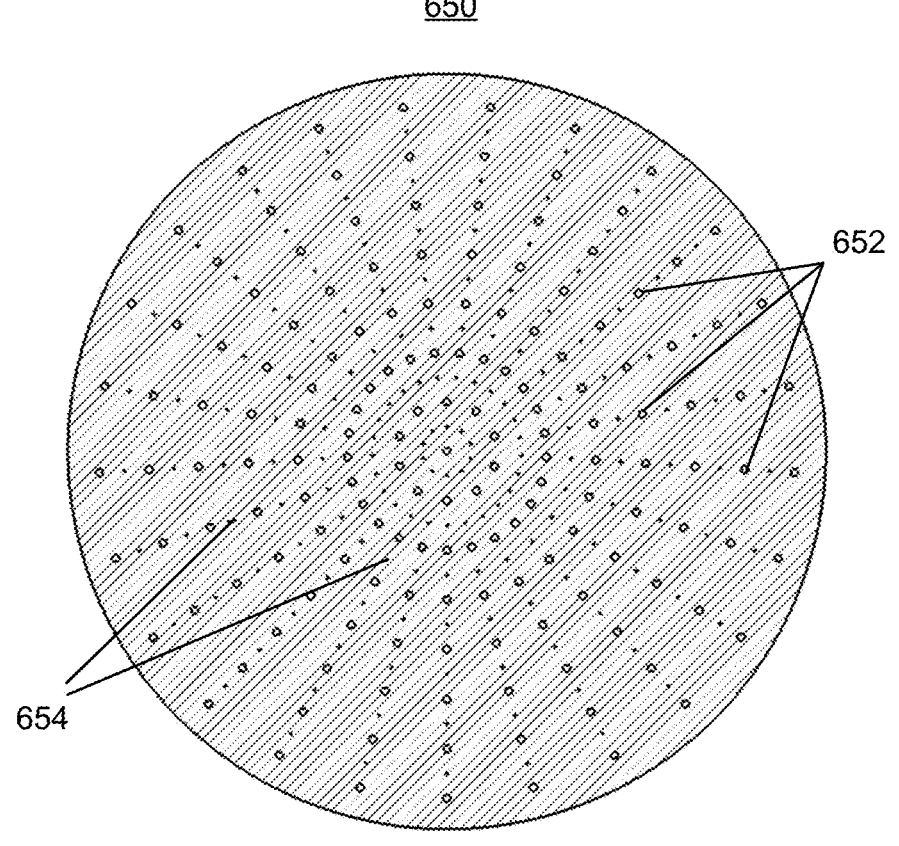
Figure 6D:
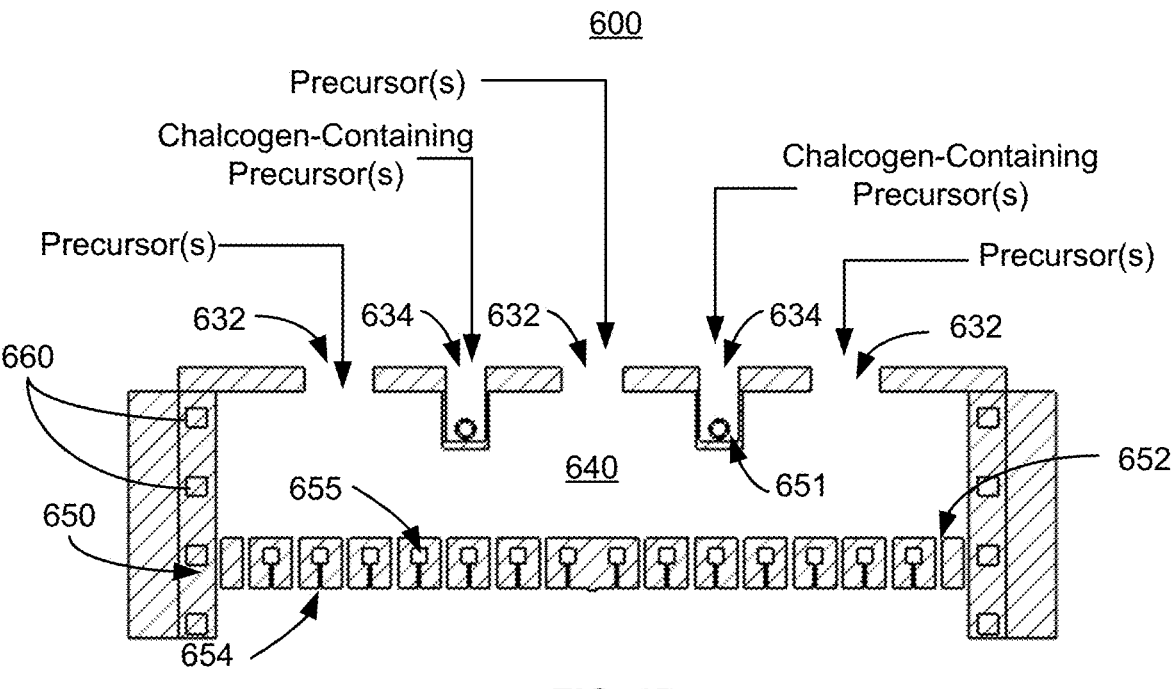

FIGS. 6A-6D are diagrams depicting a portion of vapor deposition system 600 usable in forming TMC films. FIGS. 6A-6D are not to scale and not all components may be shown. Vapor deposition system 600 is analogous to vapor deposition systems 100, 200, 300, and/or 400. Vapor deposition system 600 is described in the context of TMCs, particularly 2D TMC films. However, in some embodiments other metal chalcogenides (2D or otherwise) and/or other films may be fabricated. FIG. 6A depicts a cross-sectional view of system 600. FIGS. 6B and 6D depict a portion of system 600. FIG. 6C depicts outlets 650, which take the form of a plate 650 having apertures 652 and 654 therein. The materials used in system 600 are desired to be high-temperature resistant. For example, stainless steel, quartz, graphite, Ni, and/or Ni alloys may be used to form various portions of system 600.

Vapor deposition system 600 may be most analogous to vapor deposition system 300, which includes pre-reaction chamber 340 adjacent to reaction chamber 310. Vapor deposition system 600 is also configured in an analogous manner to system 400. Consequently, analogous components are labeled similarly. Vapor deposition system 600 includes inlets 632 and 634, reaction chamber 610 having substrate 612, pre-reaction chamber 640, and outlets 650 that are analogous to inlets 330 and 472 and 434, reaction chamber 110, 310, and 410 and pre-reaction chamber 140, 340 and (chamber) 456, and outlets 150, 350, and 450.

Reaction chamber 610 includes substrate holder 614 and outlet vent 616. Thus, reaction chamber 610 is analogous to reaction chamber 410.

Inlets 634 carry chalcogen-containing precursor(s). Inlets 634 terminate near passages 651, which carry the chalcogen-containing precursor(s) to regions 655 and apertures 654. Passages 651, regions 655, and apertures 654 are analogous to passages 451, regions 455, and apertures 454.

Inlets 632 carry precursors, such as a metal-containing precursor, to pre-reaction region 640. Precursors pass through cooling zone 661 and heat preservation zone 663. The temperature of cooling zone 661 is controlled by temperature control unit 662. In the embodiment shown, temperature control unit 662 may provide liquid (e.g. water) cooling. In other embodiments, temperature control unit 662 may control the temperature of cooling zone 661 in another manner. The temperature of heat preservation zone 663 may be controlled by temperature control unit 664. Temperature control unit 664 may be a heater. For example, temperature control unit 664 is shown as a heating coil. Other techniques may be used to control the temperature of heat preservation zone 663. In some embodiments, temperature control unit 664 may be or include infrared heater(s) and/or inductive heater(s). Cooling zone 661 and heat preservation zone 663 are used to control the temperature of precursors provided to pre-reaction region 640. Thus, both condensation and disassociation may be prevented. For example, cooling zone 661 may ensure that the temperature of precursors is below 100° C. before entering heat preservation zone 663. Thus, early dissociation of the metal-containing precursor may be reduced or eliminated. Heat preservation zone 663 aids in the precursors attaining the desired temperature in pre-reaction region 640. Therefore, the temperature of system 600 can rapidly increase in a short distance. Using temperature control unit 664 in heat preservation zone 663, the regions (and thus the gases therein) may be readily heated to (for example) 500° C. or above. In some embodiments, cooling zone 661, heat preservation zone 663, and pre-reaction region 640 significantly increases the usage rate of metal-containing precursor.

Pre-reaction region 640 may be heated by coil 660. In some embodiments, another and/or additional temperature control mechanisms might be used. For example, heating coil 660 may be replaced or supplemented by infrared heating and/or inductive heating.

In some embodiments, plate 650 includes a series of concentric inner and outer apertures (or passages) 652 and 654. Some apertures 652 carry the modified precursor and other reactants (e.g. for dopants) from prereaction chamber 640. Other apertures 654 carry the chalcogen-containing precursor. Apertures 652 and 654 are configured such that reactants from pre-reaction region 640 (e.g. the modified precursor) and the chalcogen-containing precursor are separately distributed over substrate 612 in reaction chamber 610. Thus, the reactants from pre-reaction chamber 640 (e.g. the modified precursor, dopant precursor, and/or modified dopant precursor) and the chalcogen-containing precursor meet only when/after flowing out of apertures 652 and 654 and come close to the surface of substrate 612. In the embodiment shown (e.g. in FIG. 6C), the distribution of apertures 652 and 654 near the edge of plate 650 is lower (i.e. apertures 652 and 654 are further apart further from the center of plate 650). In some embodiments, another distribution may be used. For example, apertures 652 and/or 654 may be evenly distributed across the surface of plate 650. In another example, apertures 652 and/or 654 may be more densely packed near the edge. Such a distribution may result in a more uniform flow of reactants across the surface of substrate 612. In some embodiments, apertures 652 and/or 654 may be in a rectangular (or other) array instead of arranged radially. In other embodiments, other distributions of apertures 652 and/or 654 across the surface of plate 650 may be present. Thus, the desired seeding (e.g. uniform seeding) and growth across a large area of substrate 612 may be facilitated.

In operation, the temperature of precursors is controlled from inlets 632 to pre-reaction region 640. Thus, the desired heating and flow of precursors may occur. In pre-reaction region 640, the precursors react to form the modified precursor. Pre-reaction region 640 outputs the modified precursor to reaction chamber 610 via apertures 652. Other reactants (e.g. dopants) may also be provided from pre-reaction region 640 via apertures 652. Chalcogen-containing precursor(s) flow toward plate 650 from separate inlets 634. More specifically, chalcogen-containing precursor(s) flow through inlets 634, through tubes 651 to passageways 655 and out of plate 650 through apertures 654. Thus, pathway 634/651/655/654 may be configured in an analogous manner to passage 434/451/455/454. Thus, 634/651/655/654 and 632/640/652 form separate, isolated pathways for the chalcogen-containing precursors and the precursors/reactants from the pre-reaction chamber are maintained. Thus, pathways 634/651/655/654 and 632/640/652 may be part of a gas distribution system that may be capable of independently controlling reactants from pre-reaction region 640 and the chalcogen-containing precursor. In some embodiments, the gas flow through pathways 632/640/652 are separately controlled from the gas flows through pathways 634/651/655/654. In some embodiments each of pathways 634/651/655/654 and 632/640/652 has a separately controllable flow. For example, the flow may be controlled such that the flow of reactants from apertures 652 and/or 654 may be even, may be higher at the edges, or may be configured in another manner to provide the desired distribution of reactant (e.g. a uniform distribution) across the surface of substrate 612.

The modified precursor and other reactants from pre-reaction region 640 and the chalcogen-containing precursor flowing through apertures 654, mix in reaction chamber 610. In some embodiments, the surface of substrate 612 is at least five millimeters and not more than fifty or one hundred millimeters from aperture 652 and 654. In addition, at least a portion of substrate 612 is aligned with apertures 632 and 634. Thus, a 2D TMC film may be formed on substrate 612. Uniform seeding and growth across a large area of substrate 612 may be facilitated by the distribution and size of the area of apertures 652 and 654.

Vapor deposition system 600 may share the benefits of vapor deposition systems 100, 200, 300, and/or 400. Vapor deposition system 600 may facilitate growth of a more uniform 2D TMC film having a larger area. Consequently, a variety of 2D TMC films having higher quality may be more readily fabricated using vapor deposition system 600.

Figure 7:
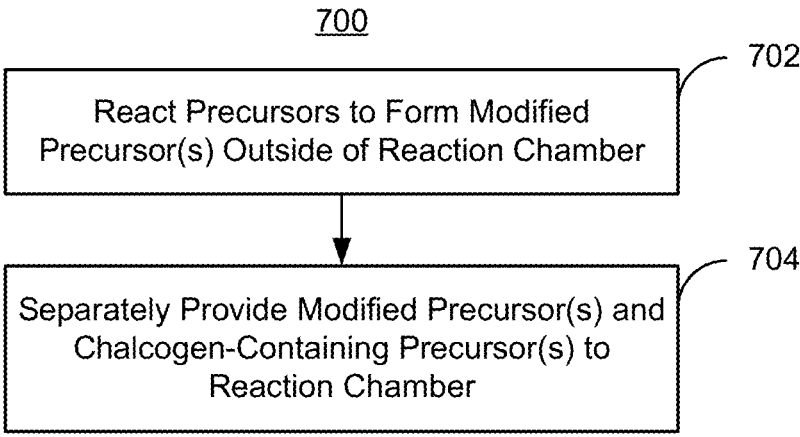
FIG. 7 is a flow chart depicting an embodiment of a method for forming a metal chalcogenide material using vapor deposition.

FIG. 7 is a flow chart depicting an embodiment of method 700 for forming a metal chalcogenide material using vapor deposition. Although described in a particular order, another order not inconsistent with the description herein may be utilized. Method 700 is described in the context of vapor deposition system 100. However, another system, including but not limited to system 200, 300, 400, and/or 600 might be used.

Precursors are reacted in a pre-reaction region to form at least one modified precursor, at 702. The precursors reacted at 702 include one or more metal-containing precursor and one or more modifiers. The modified precursors are more thermally stable than the metal-containing precursors used in forming the modified precursors. The modified precursor may have a higher disassociation temperature and/or a longer diffusion length than the corresponding metal-containing precursor. In some embodiments, the precursors also include dopant precursors, which may react with the modifiers and/or metal-containing precursors.

The modified precursor(s) and chalcogen precursor(s) are separately provided to a reaction chamber, at 704. The reaction chamber is configured such that the modified precursor(s) and the chalcogen precursor(s) react and form a TMC film on a substrate in the reaction chamber. In some embodiments, the TMC film formed is a 2D TMC film. In embodiments in which a dopant precursor is provided at 702, the dopant in the dopant precursor is incorporated in the chalcogen film. Thus, a doped chalcogen film is formed on the substrate in the reaction chamber.

For example, a metal-containing precursor $Mo(CO)_6$ may be reacted with water (modifier) in pre-reaction region 140, at 702. This may occur by heating $Mo(CO)_6$ and flowing an inert gas, such as Ar with a heated solid. In pre-reaction region 140, the $Mo(CO)_6$ and $H_2O$ react to form $Mo(CO)(x)(OH)x$ as a modified precursor. $Mo(CO)_{6-x}(OH)_x$ is provided along with, for example, $H_2S$ to reaction chamber 110, at 704. The modified precursor and chalcogen-containing precursor are kept separate until meeting in reaction chamber 110. Reaction chamber 110 may also be heated, for example to 600° Celsius-800° Celsius as part of 704. The modified precursor and chalcogen-containing precursor react, forming $MoS_2$ on substrate 112. Although described in the context of a single metal-containing precursor, modifier, and chalcogen-containing precursor, multiple metal-containing precursors, modifiers, and chalcogen-containing precursors may be used. Thus, mixed TMC films might be fabricated.

Figure 8:
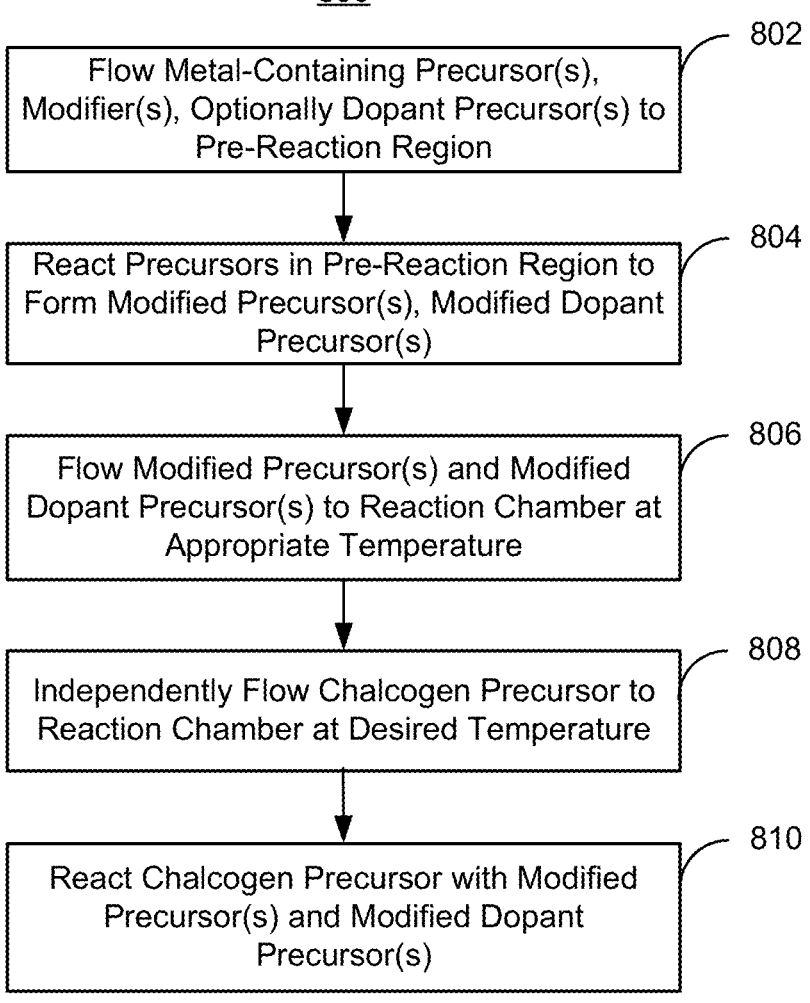
FIG. 8 is a flow chart depicting an embodiment of a method for forming a metal chalcogenide material using vapor deposition.

FIG. 8 is a flow chart depicting an embodiment of a method for forming a metal chalcogenide material using vapor deposition. Although described in a particular order, another order not inconsistent with the description herein may be utilized. Method 700 is described in the context of vapor deposition system 100. However, another system, including but not limited to system 200, 300, 400, and/or 600 might be used.

Metal-containing precursor(s) and modifier(s) are provided to a pre-reaction region, at 802. In some embodiments, 802 includes flowing an inert gas past a heated solid for the metal-containing precursor. The modifiers and, optionally, dopants may similarly be provided to the reaction chamber. At 804, the modifier, the metal-containing precursor and, optionally, the dopant precursor are reacted in the pre-reaction region. In some embodiments, this is accomplished by heating the pre-reaction region or otherwise establishing the conditions at which reactions may occur. Thus, a modified precursor may be generated. In some embodiments, the dopant precursor also reacts with the gases. Thus, a modified dopant precursor may also be generated.

The modified precursor and modified dopant precursor are flowed to the reaction chamber, at 806. In addition, the chalcogen-containing precursor is separately provided to the reaction chamber, at 808. The modified precursor, modified dopant precursor, and chalcogen-containing precursor are reacted, at 810. In some embodiments, 810 includes establishing the conditions in the reaction chamber for the reaction to occur. Thus, the desired TMC film may be grown.

For example, $Mo(CO)_6$ and water may be flowed to pre-reaction chamber 140, at 802. This may be accomplished by flowing an inert gas, such as Ar past a heated solid for the $Mo(CO)_6$. $Mo(CO)_6$ reacts with $H_2O$ in pre-reaction region 140 with the temperature in a range around 500° Celsius (e.g. 150° Celsius to 750° Celsius). The flow rate of argon (Ar) carrier gas may be selected (e.g. in range from approximately 10 sccm to 500 sccm) to dilute the precursors. At 804, the metal-containing precursors and modifier react in pre-reaction region 140. The reaction is: $Mo(CO)_6 + H_2O \rightarrow Mo(CO)_{6-x}(OH)_x$, where x depends on the ratio of metal containing-precursor to modifier and the reaction temperature. The modified precursor $Mo(CO)_{6-x}(OH)_x$ is more stable than initial precursor $Mo(CO)_6$, and thus may more readily reach reaction chamber 110. The temperature in the region of transport (e.g. channels 270 and/or outlets 150, 250, 350, 450, or 650) may be set at approximately 400° Celsius to approximately 800° C. In some embodiments, the temperature is in a range from 50° Celsius to 1000° Celsius. The modified precursor is thus provided to reaction chamber 110, at 806. In addition, a chalcogen-containing precursor such as $H_2S$ or evaporated sulfur, is carried with Ar gas (e.g. at a flow rate of 10-500 sccm) to reaction chamber 110, at 808. The modified precursor and chalcogen-containing precursor are transported in two independent paths until reaching reaction unit 110.

The modified precursor and chalcogen-containing precursor react in reaction chamber 110 to form a TMC film on substrate 112, at 810. This may include heating reaction chamber 110. The temperature of reaction chamber 110 may range from 150 to 1000° C. Reaction chamber 110 may also be evacuated, for example to a pressure in the range of 0.1 torr to 760 torr. The growth time may be used to control the size of the film so as to range from few nanometers or a few tens of nanometers to 100 micrometers or more. In some embodiments, the diameter of the film may be at least an inch, at least two inches, at least four inches or more (e.g. up to the diameter of substrate 112). By controlling the flow rate of the precursors, the number of layers of the TMC may be controlled from a monolayer to a multilayer. Thus, using method 800, the desired 2D TMC films may be achieved.

Figure 9A:
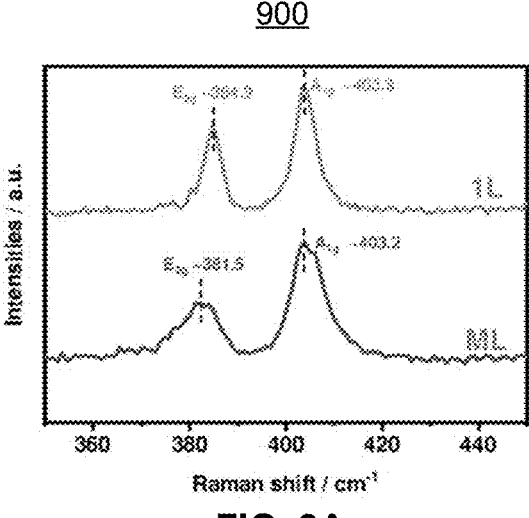
FIGS. 9A-9C depict an embodiment of a metal chalcogenide film fabricated using vapor deposition and film properties.
Figure 9B:
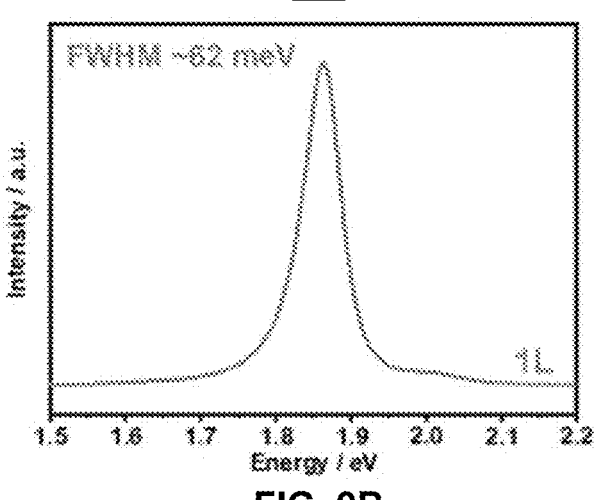
Figure 9C:
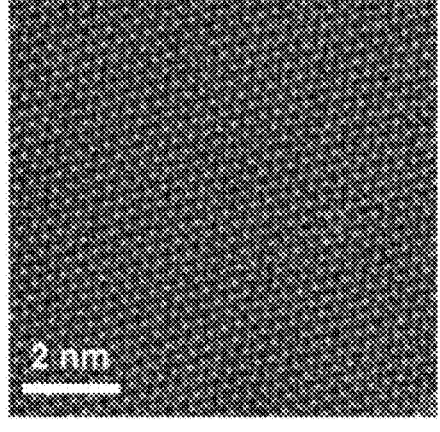

FIGS. 9A-9C are diagrams depicting an embodiment of a metal chalcogenide film formed using vapor deposition and film properties. In particular, FIG. 9A is a graph 900 depicting the Raman spectroscopy for two 2D TMC films. FIG. 9B is graph 910 depicting the photoluminescence spectrum for a monolayer 2D TMC film. FIG. 9C depicts micrograph 920 of one such 2D TMC film. The films are $MoS_2$ films formed as described herein. $Mo(CO)_6$ may be used as a metal-containing precursor, $H_2O$ used as a modifier, and S as a chalcogen. The Raman spectrum of graph 900 indicates that the $MoS_2$ films may be fabricated as a monolayer and as a multilayer. The low full width at half maximum of photoluminescence spectrum 910 indicates the desired high quality $MoS_2$ film may be obtained. In some embodiments, electronics grade thin films may be fabricated. Micrograph 920 is a high-angle annular dark-field scanning transmission microscope (HAADF-STEM) image. Micrograph 920 indicates hexagonal rings of $MoS_2$ from a top view, devoid of vacancies. Thus, using the vapor deposition system(s) and/or methods described herein, the desired 2D TMC films may be fabricated.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A vapor deposition system, comprising:
a reaction chamber configured to retain a substrate therein; and
a reactant delivery subsystem coupled with the reaction chamber and including:
a plurality of inlets for receiving a plurality of precursors and at least one chalcogen precursor;
a pre-reaction region configured to receive the plurality of precursors from a portion of the plurality of inlets and react at least a portion of the plurality of precursors to form a modified precursor, the modified precursor being more thermally stable than a metal-containing precursor of the at least the portion of the plurality of precursors; and
a plurality of outlets coupled with the reaction chamber and the pre-reaction region, the plurality of outlets being configured to provide the modified precursor from the pre-reaction region to the reaction chamber and to separately provide the at least one chalcogen precursor to the reaction chamber that is configured to retain the substrate;
wherein the substrate has a surface having a substrate area, the plurality of outlets for the at least one chalcogen precursor and for the modified precursor are distributed and interspersed over an area, at least a portion of the area being aligned with at least a portion of the substrate area; and
wherein the modified precursor and the at least one chalcogen precursor react and form a chalcogen film on the substrate in the reaction chamber.

2. The vapor deposition system of claim 1, wherein the reactant delivery subsystem includes:
a heated pre-reaction chamber including the pre-reaction region therein, the at least the portion of the plurality of precursors reacting to form the modified precursor in the absence of the at least one chalcogen precursor within the heated pre-reaction chamber; and
a distribution unit coupled with the heated pre-reaction chamber by a flow channel, the distribution unit including the plurality of outlets and being coupled with at least one inlet of the plurality of inlets for the at least one chalcogen precursor.

3. The vapor deposition system of claim 1, wherein the pre-reaction region is adjacent to the plurality of outlets and the plurality of precursors react to form the modified precursor in the absence of the at least one chalcogen precursor within the pre-reaction region.

4. The vapor deposition system of claim 1, wherein the pre-reaction region includes a heater.

5. The vapor deposition system of claim 4, wherein a temperature of the pre-reaction region is less than a reaction chamber temperature of the reaction chamber.

6. The vapor deposition system of claim 4, wherein the reactant delivery subsystem further includes:
a cooling region coupled with the portion of the plurality of inlets and the pre-reaction region, the cooling region configured to maintain a cooling region temperature less than a disassociation temperature of the metal-containing precursor.

7. The vapor deposition system of claim 1, wherein the plurality of precursors includes a modifier for the metal-containing precursor, the modifier reacting with the metal-containing precursor in the pre-reaction region to form the modified precursor.

8. The vapor deposition system of claim 1, wherein the modified precursor has a higher disassociation temperature than the metal-containing precursor.

9. The vapor deposition system of claim 1, wherein the plurality of precursors includes a dopant precursor, the chalcogen film including a dopant in the dopant precursor.

10. The vapor deposition system of claim 1, wherein a first portion of the plurality of outlets is coupled with the pre-reaction region and provides the modified precursor to the reaction chamber; and
wherein a second portion of the plurality of outlets provides the at least one chalcogen precursor to the reaction chamber separately from the modified precursor.

11. The vapor deposition system of claim 1, wherein the reactant delivery subsystem further includes:
a gas distribution system coupled with the plurality of outlets such that at least a portion of the plurality of outlets have a separately controllable flow rate.

12. The vapor deposition system of claim 1, wherein the area is at least ½ of the substrate area.

13. The vapor deposition system of claim 1, wherein the metal-containing precursor includes at least one of W or Mo element, the plurality of precursors includes at least one of water, Fe dopant, or V dopant, and the at least one chalcogen precursor includes at least one of S, Te, or Se element.

14. The vapor deposition system of claim 1, wherein the pre-reaction region is included in a pre-reaction chamber and wherein the reactant delivery subsystem further includes:
a mixing chamber coupled between the pre-reaction region and the plurality of outlets, the mixing chamber being configured to receive the modified precursor from the pre-reaction region and provide the modified precursor to the plurality of outlets.

15. The vapor deposition system of claim 1, wherein the reaction chamber is configured to allow mixing of the modified precursor and the at least one chalcogen precursor in a portion of the reaction chamber between the plurality of outlets and the substrate area.

16. A method, comprising:

reacting at least a portion of a plurality of precursors in a pre-reaction region to form a modified precursor, the modified precursor being more thermally stable than a metal-containing precursor of the at least the portion of the plurality of precursors; and separately providing the modified precursor from the pre-reaction region and at least one chalcogen precursor to a reaction chamber that is configured to retain a substrate;

wherein the substrate has a surface having a substrate area, the separately providing including separately providing the at least one chalcogen precursor and the modified precursor from a plurality of outlets distributed and interspersed over an area, at least a portion of the area being aligned with at least a portion of the substrate area; and wherein the modified precursor and the at least one chalcogen precursor react and form a chalcogen film on the substrate in the reaction chamber.

17. The method of claim 16, further comprising:

delivering the plurality of precursors to the pre-reaction region, the plurality of precursors including a dopant precursor; and wherein the dopant in the dopant precursor is incorporated in the chalcogen film, forming a doped chalcogen film on the substrate in the reaction chamber.

18. The method of claim 16, wherein the plurality of precursors further includes modifier for the metal-containing precursor.

* * * * *